United States Patent [19]

Aiello

[11] Patent Number: 4,581,922

[45] Date of Patent: Apr. 15, 1986

[54] METHOD OF AND DEVICE FOR OBTAINING THE PEAK VALUE OF A SIGNAL AND APPLICATION TO A METHOD OF AND DEVICE FOR DETERMINING THE HARDNESS OF A SOIL

[75] Inventor: Giovanni Aiello, Montereau, France

[73] Assignee: Soletanche, Nanterre, France

[21] Appl. No.: 591,513

[22] Filed: Mar. 20, 1984

[30] Foreign Application Priority Data

Mar. 22, 1983 [FR] France ............................. 83 04647

[51] Int. Cl.⁴ .............................................. G01N 3/48
[52] U.S. Cl. ........................................ 73/82; 307/351; 324/103 P
[58] Field of Search ................... 73/78, 82; 324/103 P, 324/102; 307/351; 175/50

[56] References Cited

U.S. PATENT DOCUMENTS

| | | | |
|---|---|---|---|
| 2,790,968 | 4/1957 | Cook et al. | 73/78 |
| 3,939,365 | 2/1976 | Lindgren | 307/351 |
| 4,295,099 | 10/1981 | Evans | 307/351 |
| 4,311,960 | 1/1982 | Barr | 324/103 P |
| 4,363,976 | 12/1982 | Minor | 307/351 |

*Primary Examiner*—S. Clement Swisher
*Attorney, Agent, or Firm*—Guy W. Shoup

[57] ABSTRACT

A method of obtaining the peak value of a signal. The signal is sampled at certain intervals of time. The value of the sampled signal is compared subsequent to sampling with a value previously stored in a memory. The higher of the two compared values is stored in the memory for later comparison with a value obtained during a subsequent sampling. The higher of the values stored in the memory is stored in another memory after a maximum signal has been obtained.

17 Claims, 7 Drawing Figures

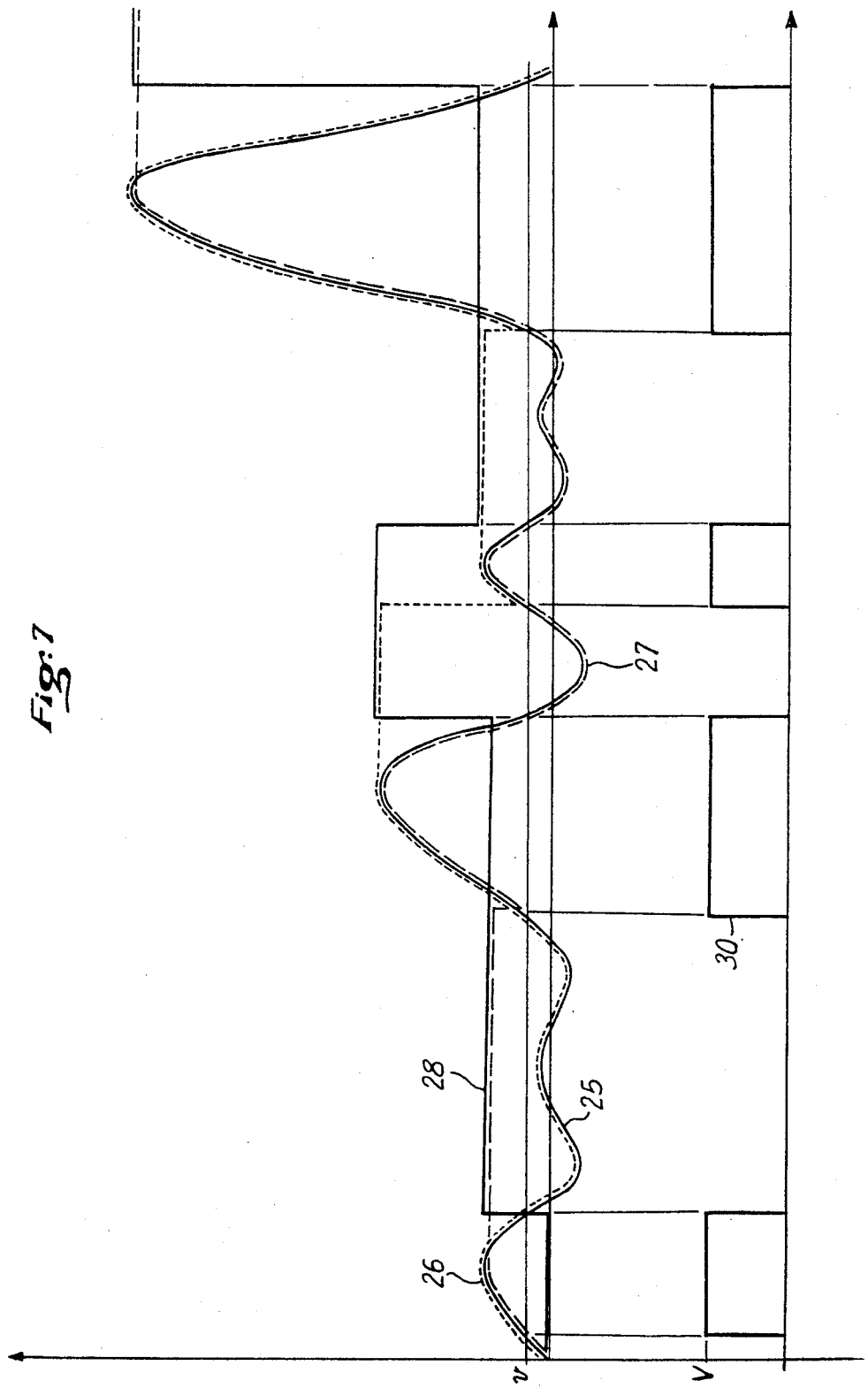

METHOD OF AND DEVICE FOR OBTAINING THE PEAK VALUE OF A SIGNAL AND APPLICATION TO A METHOD OF AND DEVICE FOR DETERMINING THE HARDNESS OF A SOIL

BACKGROUND OF THE INVENTION

The present invention relates initially to a method of obtaining the peak value of a signal.

What is generally of essential interest when pulsed or oscillating signals are measured is the signal shape itself, which can be employed to deduce parameters like amplitude, attenuation, period, harmonics, etc. which supply more accurate information as to the physical phenomenon that provokes the signal and even indicate its source.

In certain special cases, however, the shape of the signal can be ignored in favor of its peak value. This is true for example when measuring the reaction exerted by the soil against a drilling bit in order to determine the characteristics of soil hardness during drilling.

SUMMARY OF THE INVENTION

One object of the present invention is a method and device that allow the peak value to be obtained either throughout a predetermined period or between two instants determined by the characteristics of the signal itself.

This object is attained in accordance with the invention in a method of obtaining the peak value of a signal wherein the signal is sampled at certain intervals of time, the value of the sampled signal is compared subsequent to sampling with a value previously stored in a memory, the higher of the two compared values is stored in the memory for later comparison with a value obtained during a subsequent sampling, and the higher of the values stored in the memory is stored in another memory after a maximum signal has been obtained.

The first memory can consist of a single memory in the strict sense in which a new sample value replaces the preceding sample valve if the new value is higher, or of a number of memory locations in which the successively sampled values are stored. The first memory may in particular contain two memory locations, one storing the higher value obtained since the commencement of sampling and the other following the current value of the signal.

In one embodiment of the invention sampling commences at a predetermined instant.

This is the case in particular when information as to the peak value of a signal during a predetermined period, between two impacts against a drilling bit for instance, is desired. More generally, this system is possible whenever the signal being investigated has a pseudoperiod.

In another embodiment of the invention sampling commences when the value of the signal exceeds a certain threshold.

This is the case when a signal is completely random and has no periodicity.

It is also possible to store in the second memory the aforesaid maximum of the values stored in the first memory either at predetermined instants or when the value of the signal drops below a certain threshold.

Another object of the invention is a method of determining the hardness of the soil wherein drilling is conducted in the soil, especially by means of a percussion drill, the value of the reaction of the soil against the bit subsequent to the percussions is obtained by means of a sensor, and the peak value of the signal leaving the sensors is obtained by a method like that just described.

Actually, an impact applied to the bit produces a series of oscillations in reaction. It will be evident that the peak value of the reaction, which corresponds to the value of the reaction, strictly speaking, of the soil subsequent to an impact exerted by the bit, is characteristic of the hardness of the soil—the harder the soil the more powerful the reaction.

In one particular embodiment of the invention the value of the impact exerted by the drill on the bit is also obtained and its peak value compared with that of the reaction of the soil against the bit.

An absolute measure of the hardness of the soil is thus obtained, whereas measuring the peak value of the reaction alone yields only a relative measure for a given drill under given conditions, for an impact having given characteristics that is. Another object of the invention is a device for obtaining the peak value of a signal, wherein there are a first and a second sampling circuit, each having an input and an output and designed so that in a first state the output always has the same value as the input and in a second state the output is blocked to a constant value, there are means for supplying the signal to the inputs of each sampling circuit, means of comparing the output from the first sampling circuit with the output from the second sampling circuit, of shifting the sampling ciruit with the higher output into the second state and the sampling circuit with the lower output into the first state at certain intervals of time, of storing the output of one or the other sampling circuit at given instants, and of connecting the output from the sampling circuit with the higher value to the input of said means of storage.

The storage means in one preferred embodiment of the invention consist of a third sampling circuit and of means of shifting it from its second to its first state at said given instants and back into its second state again.

In other words, the third sampling circuit memorizes at each said given instant the value of the output from whichever of the two other sampling circuits has the higher output value.

The device in accordance with the invention may include means of predetermining the said instants at which the output from one or the other of the first and second sampling circuits are stored or, alternatively, means for comparing said signal to a reference value and for storing the output from one or the other of the first and second sampling circuits when the signal drops below said reference value.

The device may include means for initializing the intervals of time during which the first and second sampling circuits are shifted one into its first state and the other into its second state as a function of the relative values of their outputs.

Said means for initialization may include means of predetermining the instants at which the intervals are initialized or means for comparing said signal to a reference value and for initializing the intervals when the signal exceeds said reference value.

In one particular embodiment of the invention the device includes two measuring channels, each having a first and a second sampling circuit for two different input signals and means of division for obtaining the quotient of the value obtained by the first measuring channel and the value obtained by the second measuring channel.

A device of this type allows an absolute value of the hardness of the soil for example to be obtained no matter what type of drill is employed when applied to measuring the hardness of the soil. Another object of the invention is a device for determining the hardness of the soil and comprising a percussion drill, at least one sensor for obtaining the value of the reaction of the soil against the drilling bit subsequent to the percussions, and a device of the aforesaid type for obtaining the peak value of the output signal from the sensor.

The sensor can also be designed to obtain the value of the impact exerted by the bit on the soil, with that value being supplied along with that of the reaction of the soil to one of the measuring channels in a device with two measuring channels.

Some preferred embodiments of the invention will now be described with reference to the attached drawings, wherein

BRIEF DESCRIPTION OF THE DRAWINGS

FIG. 7 is a graph illustrating how the device illustrated in FIG. 6 operates.

DETAILED DESCRIPTION OF THE PREFERRED EMBODIMENTS

Figure 1:
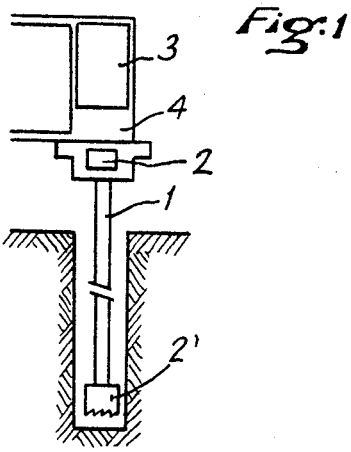
FIG. 1 is a vertical section through a drill of a type that can be employed in conjunction with the invention.

FIG. 1 shows a percussion drill of a known type in which a train 1 of shafts rotates a bit 2' and a piston 3 that moves inside a cylinder 4 subject to hydraulic or pneumatic pressure exerts an impact at a given rate on the top of train 1. An acceleration sensor 2 is positioned above the train 1 of shafts in the drill illustrated in FIG. 1, although it may also be positioned just above bit 2' for greater precision of measurement.

Figure 2:
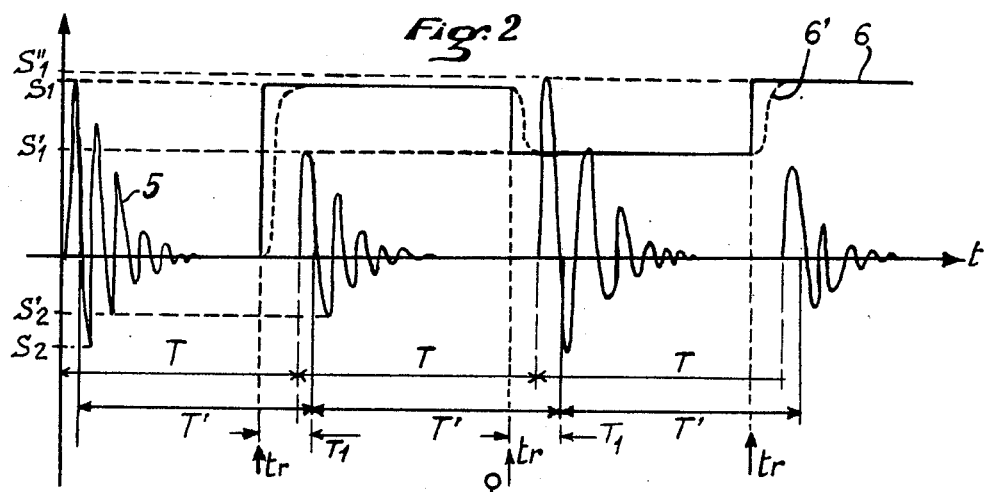
FIG. 2 is a graph of the input and output signals of a device in accordance with the invention.

FIG. 2 illustrates a signal 5 on an indefinite vertical scale as a function of time. Signal 5 consists of a series of rapidly attenuated oscillations that commence at intervals of time with a period T. Each oscillation is practically independent of the others and, in particular, its positive and negative peak values, $S_1$ and $S_2$ respectively for example are random. A signal of this type for example is what is obtained by sensor 2 on the drill's gear box and the value $S_1$ of the positive peak will then represent the reaction exerted by the soil on the bit 2' through shaft train 1. The oscillations correspond to the vibrations that propagate in one direction and in the other within shaft train 1 subsequent to each impact exerted by piston 3.

In the present description the value of the signal represented by the curve 6 consisting of steps of duration T' approximately equal to T and having an amplitude $S_1$, $S_1'$, $S_1''$, ... that equals the maximum positive amplitude of the signal 5 in the immediately preceding period is called the positive peak value of signal 5.

Curve 6 can in certain applications be slightly smoothed as represented by curve 6'.

The negative peak value of signal 5 can similarly be defined as the successive negative maxima $S_2$, $S_2'$, ... of signal 5.

Figure 3:
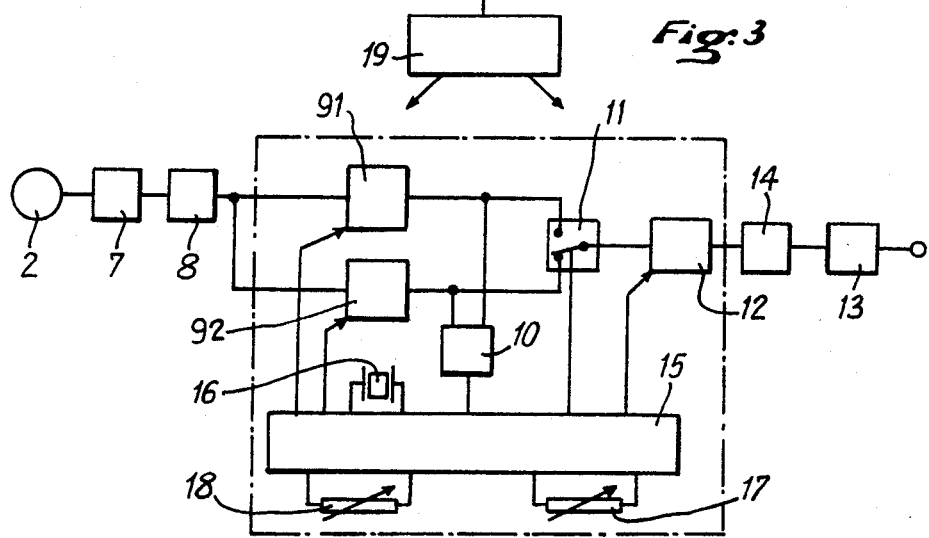
FIG. 3 is a block diagram of one embodiment of a device in accordance with the invention.

FIG. 3 is a block diagram of a circuit capable of supplying the positive peak value of signal 5 obtained by sensor 2 in FIG. 1.

Sensor 2, which can for example be piezoresistant, transforms the detected acceleration into an analog electric signal.

The output of sensor 2 is connected in a known way of an element 7 consisting of an adaptation stage and an inverting amplifier with automatic gain control and zero setting.

Element 7 can be followed by a pulse former 8 that in the present case inverts the received signal and then suppresses the negative part of the inverted signal by means of rectification to yield only the reaction of the soil against bit 2'.

The output from pulse former 8 is applied to the inputs of two sampler-blockers 91 and 92. The outputs of sampler-blockers 91 and 92 are connected to the two inputs of a comparator 10 and to the two channels of a two-way switch 11.

The output from switch 11 is applied to the input of a third sampler-blocker 12. The output of sampler-blocker 12 is connected in a known way to an output adaptor 13 through a variable-slope filter 14.

A control logic 15 that is controlled by a quartz crystal 16 allows the output from comparator 10 to be analyzed and two-way switch 11 and sampler-blockers 91, 92, and 12 to be governed.

The sampler-blockers can operate either in a follower mode in which the output signal always has the same value as the input signal or in a blocking mode in which the output is blocked to a constant value.

Control logic 15 is designed to first initialize the sampler-blockers 91 and 92 and then to shift the sampler-blocker with the higher output signal into the blocking mode and the sampler-blocker with the weaker output signal into the follower mode at a frequency $T_o$ as a function of the output from comparator 10. Two-way switch 11 is also governed by control logic 15 during a period $t_2$ that will be described later herein to connect its output to the output of whichever sampler-blocker 91 or 92 has the higher output signal.

Finally, control logic 15 is designed to shift both sampler-blockers 91 and 92 into the blocking mode at an instant $t_r$ at which sampler-blocker 12, which has been in the blocking mode, is shifted into the follower mode during a time $T_1$ that is brief but long enough to acquire the value of the output signal from two-way switch 11.

Time $T_1$ is illustrated in FIG. 2 in relation to the curve 6 of the positive peak values of signal 5.

A potentiometer 17 allows the sampling rate of sampler-blockers 91 and 92 to be controlled and a potentiometer 18 allows the period T' during which the contents of sampler-blocker 12 are renewed to be established.

Finally, a supply circuit 19 delivers the various voltages required by the device.

The operation of the device illustrated in FIG. 3 will now be described with reference to FIG. 4.

Figure 4:
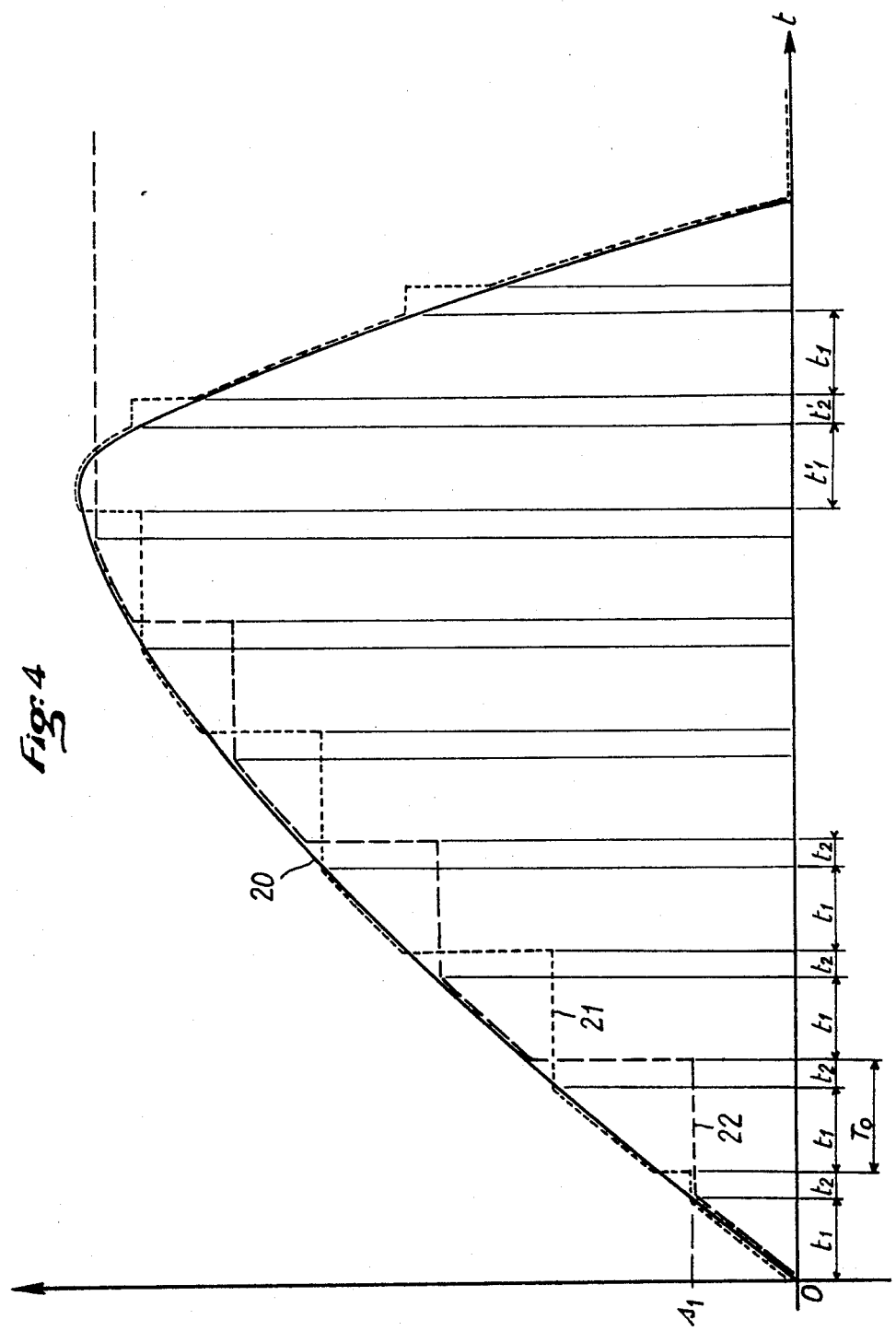
FIG. 4 is a graph illustrating how the device illustrated in FIG. 3 operates.

FIG. 4 illustrates a signal 20 that has been shaped and applied to the inputs of sampler-blockers 91 and 92 as a function of time in the form of a continuous-line curve.

At time 0 control logic 15 shifts both sampler-blockers 91 and 92 into the follower mode, meaning that their outputs, represented by dotted curve 21 and dashed curve 22 coincide with continuous-line curve 20. At the end of a time $t_1$ sampler-blockers 91 and 92 are both shifted by control logic 15 into the blocking mode for a time $t_2$ so that their outputs remain constant and equal to the value $s_1$ attained at the end of time $t_1$.

During time $t_2$ control logic 15 tests the output from comparator 10 and maintains the sampler-blocker with the higher output or, if the outputs are equal, sampler-blocker 92 in the blocking mode to the end of time $t_2$, the other sampler-blocker being restored to the follower mode.

During the second period of time $t_1$ sampler-blocker 91 is accordingly shifted into the follower mode so that dotted curve 21 coincides with continuous-line curve 20, whereas sampler-blocker 92 is shifted into the blocking mode so that dashed curve 22 remains horizontal.

At the end of the second period $t_1$ control logic 15 shifts both sampler-blockers 91 and 92 into the blocking mode and tests the output from comparator 10. Sampler-blocker 91, having the higher output, is maintained in the blocking mode to the end of second period $t_2$, whereas sampler-blocker 92 is shifted into the follower mode with its output following continuous-line curve 20.

This procedure is carried out up to a period $t_1'$ (with a duration equal to $t_1$), during which sampler-blocker 92 for instance is in the blocking mode an sampler-blocker 91 is in the follower mode. During period $t_1'$ signal 20 attains its maximum and begins to decrease so that the output from sampler-blocker 91 becomes lower than that from sampler-blocker 92.

At the end of period $t_1'$ control logic 15 shifts both sampler-blockers 91 and 92 into the blocking mode for a period $t_2'$ (with a duration equal to $t_2$) and tests the output from comparator 10. Since the output from sampler-blocker 92 is in this case higher than that from sampler-blocker 91, sampler-blocker 92 is maintained in the blocking mode while sampler-blocker 91 is restored to the follower mode for another period $t_1$, at the end of which the test is repeated.

It will be evident that one of the sampler-blockers 91 and 92 (in the present case sampler-blocker 92) has registered a value perceptibly equal to the peak value of the signal represented by continuous-line curve 20. Consequently, during the same period $t_2'$ two-way switch 11 connects the input of sampler-blocker 12 to the output of sampler-blocker 92 and the value of the output is then stored by sampler-blocker 12 as described in the foregoing.

In practice a period T' is selected that is slightly longer than the period of the phenomenon being analyzed, period T that is.

Figure 5:
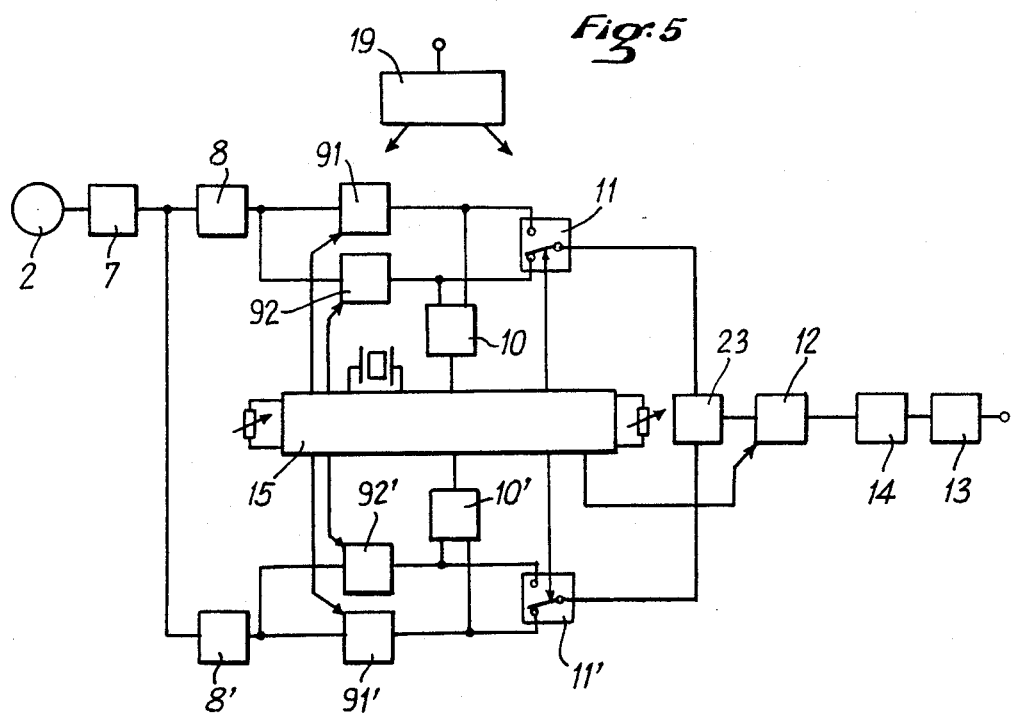
FIG. 5 is a block diagram of another embodiment of the invention.

It will be evident that the device illustrated in FIG. 5 constitutes a group of two devices of the type illustrated in FIG. 3.

This device employs two pulse formers 8 and 8'. While pulse former 8 inverts and then rectifies the signal applied to its input, pulse former 8' only rectifies it.

Each signal leaving pulse formers 8 and 8' is applied to a measurement channel similar to the device illustrated in FIG. 3.

Thus the output signal from pulse former 8 is applied to the input of both sampler-blockers 91 and 92 while the output signal from pulse former 8' is applied to to other sampler-blockers 91' and 92'.

The second measurement channel also has a comparator 10' and a two-way switch 11' similar to comparator 10 and two-way switch 11 in the first measurement channel.

Both measurement channels are governed by the same control logic 15.

The outputs from two-way switches 11 and 11' are applied to a divider 23. The output from divider 23 is applied to the input of sampler-blocker 12.

Hence, sampler-blocker 12 and consequently the device illustrated in FIG. 5 no longer store the peak value of the positive or negative part of the signal applied to the input of element 7 but rather the ratio of the positive to the negative peak values, which, when the device is employed to measure the hardness of a soil, yields an absolute result and not a relative result as with the circuit illustrated in FIG. 3.

Figure 6:
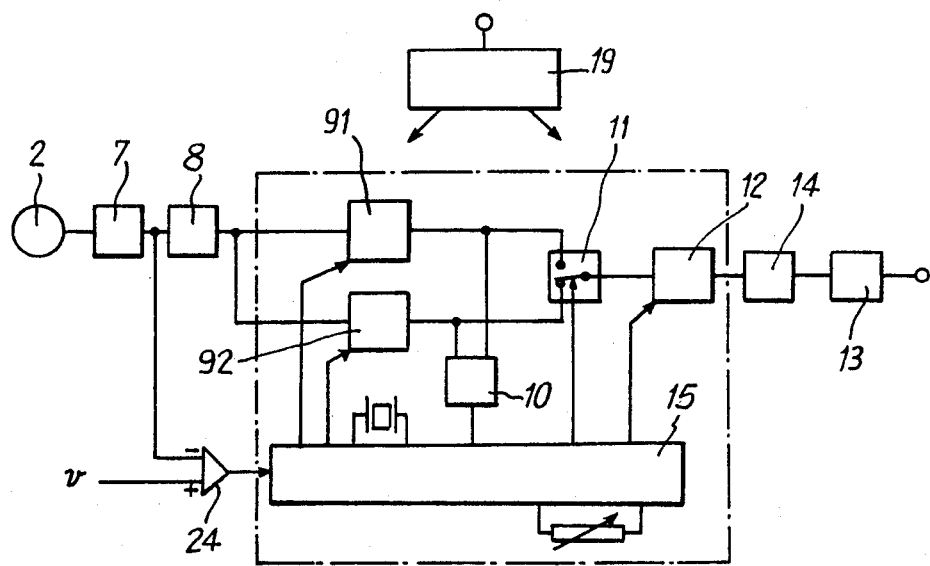
FIG. 6 is a block diagram of still another embodiment of the invention.

The device in FIG. 6 is a version that can be utilized with a completely random signal, which contains no pseudoperiods T. In this case control logic 15 does not supply duration T' and instant $t_r$, which are deduced from the signal form itself to control the device.

In this version a threshold amplifier 24 is positioned at the output of an adaptation stage 7, an amplifier that has an output signal 30 that equals 0 when the signal applied to its negative input is below a reference value v and that equals V when the signal applied to its negative input is higher than v.

The output from threshold amplifier 24 is applied to and governs control logic 15.

When the output from threshold amplifier 24 passed from 0 to V, sampler-blockers 91 and 92 are initialized and operate in cycles similar to those described with reference to FIG. 4. These cycles are not illustrated in detail in FIG. 7 for the sake of simplicity.

On the other hand, when the output from threshold amplifier 24 passes from V to 0, two-way switch 11 connects the input of sampler-blocker 12 to the output of whichever sampler-blocker 91 or 92 has the higher output signal and initiates renovation of the value stored in sampler-blocker 12.

The continuous-line curve 25 in FIG. 7 represents the signal entering the device, the two broken-line curves 26 and 27 represent in a simplified way the output value from sampler-blockers 91 and 92, and the step curve 48 represents the value of the output from sampler-blocker 12.

It will be evident that the device illustrated in FIG. 6 leads to a result that is somewhat similar to that of the device illustrated in FIG. 3. The beginning of fixed periods T', however, is replaced with an ascending front from the output of threshold amplifier 24 and instant $t_4$ is replaced by a descending front from the output of threshold amplifier 24.

The present specification and claims are of course intended solely as illustrative of one or more potential embodiments of the invention and should not be construed as limiting it in any way. The invention may accordingly be adapted and modified in many ways without deviating from the theory behind it or exceeding its scope of application.

Thus, the devices described with reference to FIGS. 3, 5, and 6 can be utilized to analyze signals other than those deriving from an accelerometer mounted on a drill.

Furthermore, a simple rotating drill, without percussion, can be employed for the drilling with the vibrations resulting from the rotation of the shaft train being processed, especially with respect to the device described with reference to FIGS. 6 and 7.

I claim:

1. Method of obtaining the peak value of a signal, comprising the steps of sampling the signal at certain intevals of time, comparing the value of the sampled signal subsequent to sampling with a value previously stored in a first memory, storing in said first memory the higher of the two compared values for later comparison with a value obtained during a subsequent sampling, and storing in a second memory the higher of the values stored in said first memory after a maximum signal has been obtained.

2. Method as in claim 1 wherein sampling commences at a predetermined instant.

3. Method as in claim 1 wherein sampling commences when the value of the signal exceeds a certain threshold.

4. Method as in any one of claims 1 through 3 wherein the aforesaid maximum of the values stored in the first memory is stored in the second memory at predetermined instants.

5. Method as in any one of claims 1 through 3 wherein the aforesaid maximum of the values stored in the first memory is stored in the second memory when the value of the signal drops below a certain threshold.

6. Method as in any one of claims 1 through 3 of determining the hardness of the soil wherein drilling is conducted in the soil, especially by means of a percussion drill, the value of the reaction of the soil against the bit subsequent to the percussions is obtained by means of a sensor, and the peak value of the signal leaving the sensors is obtained by a method as in any of those claims.

7. Method as in claim 6 wherein the value of the impact exerted by the drill on the bit is also obtained and its peak value compared with that of the reaction of the soil against the bit.

8. Device for obtaining the peak value of a signal, wherein there are a first and a second sampling circuit, each having an input and an output and designed so that in a first state the output always has the same value as the input and in a second state the output is blocked to a constant value, and there are means for supplying the signal to the inputs of each sampling circuit, means for comparing the output from the first sampling circuit with the output from the second sampling circuit, means for shifting the sampling circuit with the higher output into the second state and the sampling circuit with the lower output into the first state at certain intervals of time, storage means for storing the output of one or the other sampling circuit at given instants, and means for connecting the output from the sampling circuit with the higher value to the input of said storage means.

9. Device as in claim 8 wherein the storage means comprises a third sampling circuit and means for shifting it from its second to its first state at said given instants and back into its second state again.

10. Device as in either of claims 8 and 9 with means for predetermining the said instants at which the output from one or the other of the first and second sampling circuits are stored.

11. Device as in either of claims 8 and 9 with means for comparing said signal to a reference value and for storing the output from one or the other of the first and second sampling circuits when the signal drops below said reference value.

12. Device as in any one of claims 8 through 9 with means for initializing the intervals of time during which the first and second sampling circuits are shifted one into its first state and the other into its second state as a function of the relative values of their outputs.

13. Device as in claim 12 wherein said means for initialization include means for predetermining the instants at which the intervals are initialized.

14. Device as in claim 12 wherein said means for initialization include means for comparing said signal to a reference value and for initializing the intervals when the signal exceeds said reference value.

15. Device as in any one of claims 8 through 9 with two measuring channels, each having a first and a second sampling circuit for two different input signals and dividing means for obtaining the quotient of the value obtained by the first measuring channel and the value obtained by the second measuring channel.

16. Device as in any one of claims 8 through 9 for determining the hrdness of a soil and comprising a percussion drill having a drilling bit, at least one sensor for obtaining the value of the reaction of the soil against the drilling bit subsequent to the percussions, and a device as in any of those claims for obtaining the peak value of the output signal from the sensor.

17. Device as in claim 16 wherein the sensor is designed to obtain the value of the impact exerted by the bit on the soil, with that value being supplied along with that of the reaction of the soil to one of the measuring channels.

* * * * *